(12) United States Patent
Lule (10) Patent No.: US 8,279,312 B2
(45) Date of Patent: Oct. 2, 2012

(54) IMAGE SENSOR ELEMENT WITH MULTIPLE OUTPUTS

(75) Inventor: Tarek Lule, Saint Egreve (FR)

(73) Assignee: STMicroelectronics S.A., Montrouge (FR)

( * ) Notice: Subject to any disclaimer, the term of this patent is extended or adjusted under 35 U.S.C. 154(b) by 899 days.

(21) Appl. No.: 11/603,280

(22) Filed: Nov. 21, 2006

(65) Prior Publication Data

US 2007/0153109 A1    Jul. 5, 2007

(30) Foreign Application Priority Data

Nov. 24, 2005    (EP) .................................... 05111264

(51) Int. Cl.
H04N 3/14 (2006.01)
H04N 5/335 (2011.01)

(52) U.S. Cl. ........................ 348/308; 348/294

(58) Field of Classification Search ................ 348/308, 348/294
See application file for complete search history.

(56) References Cited

U.S. PATENT DOCUMENTS

| | | | | |
|---|---|---|---|---|
| 4,843,339 A | * | 6/1989 | Burt et al. ........................ 330/10 |
| 5,629,890 A | * | 5/1997 | Engh et al. ................ 365/185.03 |
| 5,754,470 A | * | 5/1998 | Engh et al. ................ 365/185.03 |
| 6,246,436 B1 | * | 6/2001 | Lin et al. ........................ 348/308 |
| 6,504,141 B1 | * | 1/2003 | Kozlowski et al. ........ 250/214 A |
| 7,436,496 B2 | * | 10/2008 | Kawahito ...................... 356/5.01 |
| 2005/0052554 A1 | * | 3/2005 | Sakurai et al. ................ 348/301 |
| 2006/0146159 A1 | * | 7/2006 | Farrier ........................ 348/308 |
| 2006/0146161 A1 | * | 7/2006 | Farrier ........................ 348/308 |
| 2006/0181627 A1 | * | 8/2006 | Farrier ........................ 348/308 |
| 2006/0192938 A1 | * | 8/2006 | Kawahito ..................... 356/5.03 |

FOREIGN PATENT DOCUMENTS

| | | | |
|---|---|---|---|
| JP | 2003134396 A | * | 5/2003 |
| WO | WO 2006073875 A | | 7/2006 |

OTHER PUBLICATIONS

European Search Report dated Feb. 19, 2007 from corresponding European Application 06124687.

* cited by examiner

*Primary Examiner* — Chieh M Fan
*Assistant Examiner* — Antoinette Spinks
(74) *Attorney, Agent, or Firm* — Wolf, Greenfield & Sacks, P.C.

(57) ABSTRACT

The present invention concerns an image sensor having a plurality of pixels each including a photosensor, a first node having a first capacitance connected to the photosensor, a second node having a second capacitance and selectively connected to the photosensor, and reading circuitry operable to read independently a first voltage value stored at the first node and a second voltage value stored at the second node.

23 Claims, 6 Drawing Sheets

IMAGE SENSOR ELEMENT WITH MULTIPLE OUTPUTS

BACKGROUND OF THE INVENTION

1. Field of the Invention

The present invention relates to solid-state image sensors, specifically to charge detection elements of image sensors detecting any kind of radiation such as but not limited to visible light.

2. Discussion of the Related Art

A typical image sensor senses radiation by converting impinging radiation into charges that are integrated (collected) in sensor pixels. During or after completion of an integration cycle, the charge is converted into a voltage that is supplied to the output terminals of the sensor.

Figure 1:
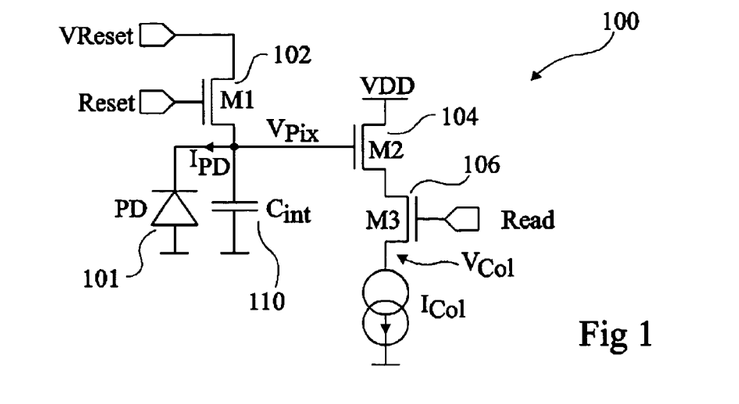
FIG. 1 is a circuit diagram of a three transistor (3T) image sensing pixel.
Figure 2:
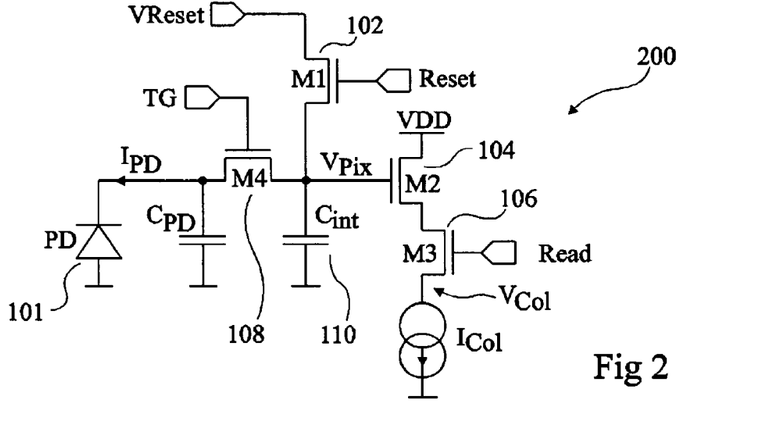
FIG. 2 is a circuit diagram of a four transistor (4T) image sensing pixel.

Typical basic pixel architectures are built around 3 or 4 transistors, the so called 3T and 4T architectures which are shown in FIGS. 1 and 2 labelled 100 and 200 respectively. With reference to FIGS. 1 and 2, in these architectures a photodiode PD 101 converts received radiation into a charge, and a first transistor M1, labelled 102, is dedicated to resetting the sensing node, while two further transistors, M2 and M3, labelled 104, 106, are dedicated to the selective readout of a signal voltage generated inside the pixel. A fourth transistor M4, labelled 108 and shown in the 4T configuration of FIG. 2, is provided to transfer signal charges from the radiation sensing element to a separate charge storage node.

Commonly, an integration capacitor $C_{int}$ of the sensor, which stores a charge related to the impinging radiation, is provided by the parasitic capacitances of the source of transistor 102 and the gate of transistor 104 and the wiring between these components, all of which are usually tried to be kept small, so as to increase the sensitivity of the image sensor. This capacitance is represented by capacitor 110 in FIGS. 1 and 2.

Both architectures may be limited in their dynamic range by the charge handling capacity, also called pixel Full Well (FW), which is defined as the amount of charge that can be stored by the integration capacitor $C_{int}$ 110 without exceeding the voltage range that can be handled by the reset transistor M1 102, the transfer transistor M4 108 in the case of architecture 200 of FIG. 2, the readout transistors M2 104 and M3 106, and the subsequent stages of signal processing. Since a larger dynamic range allows for better image quality, one of the targets of image sensor design is to increase the charge handling capacity of the pixel.

One approach for increasing the charge handling capacity is to increase the capacitance of the integration capacitor, $C_{int}$ 110, through the addition of an extra capacitor in parallel. An example of this solution, called 4TC, is described by H. Rhodes in "CMOS imager technology shrinks and image performance", published on pages 7-18 in "2004 IEEE Workshop on Microelectronics and Electron Devices".

Figure 3:
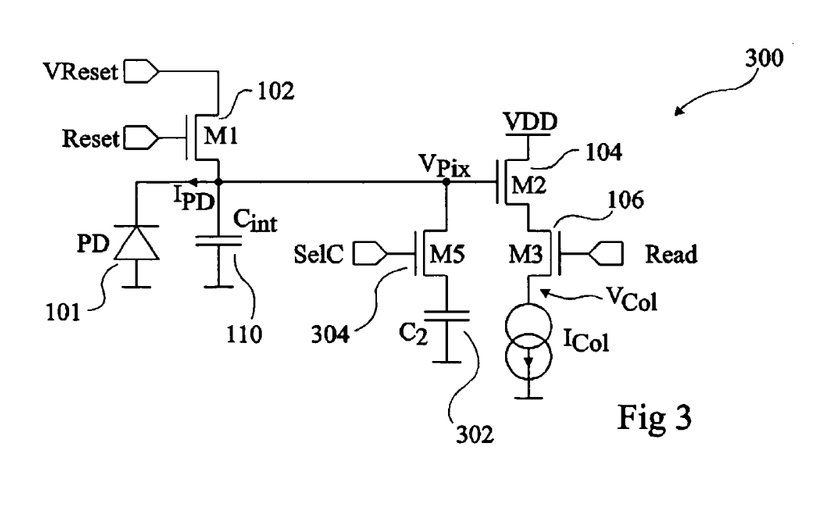
FIG. 3 is a circuit diagram of a three transistor (3T) pixel with additional fourth transistor that allows selectable operation in high or low sensitivity modes.

While in this solution this extra capacitive charge handling capability is permanently effective, an alternative approach is described in the "2003 Workshop on CCDs and Advanced Image Sensors" in a paper titled "Programmable sensitivity image sensor with multi-capacitance CMOS pixels" from Ryutaro Oi of University of Tokyo, and such an image sensor 300 is shown in FIG. 3. Here, the additional capacitor C2, labelled 302, is connected to a radiation sensing node $V_{Pix}$ through a select transistor M5 304 controlled by a select signal SelC. Node $V_{Pix}$ is a node at which the charge generated by photodiode 101 is stored. Principally the pixel can be operated in two modes: one high full well mode with transistor M5 304 turned ON and thus capacitor C2 added in parallel to capacitor $C_{int}$ to give a larger full well; the other with transistor M5 304 turned OFF to give a higher sensitivity while compromising the capacity of the full well. But, according to the authors, this pixel also allows operation with high full well and high sensitivity in one and the same integration frame, by turning ON and OFF the select transistor M5 304 during integration. However, during readout, the charge stored by the capacitor $C_{int}$ must be read out first, then transistor M5 304 is turned ON again to allow the charges stored by capacitor $C_2$ to be read out.

Figure 4:
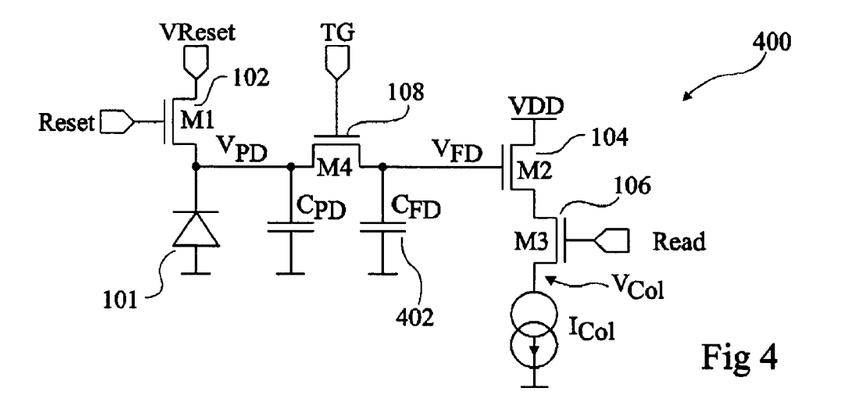
FIG. 4 is a circuit diagram of a pixel with four transistors allowing operation in a global shutter mode.

It can be a further requirement in various applications to provide a global shutter to reduce motion distortion, especially where the time to read the sensor plane is long compared to typical motion distortion times, such as in the case of multi-megapixel sensors. A solution that has been proposed is depicted in FIG. 4, which shows an image sensor 400 similar to the circuit of FIG. 2, except that reset transistor M1 102 is connected directly to photodiode 101 in image sensor 400 and the integration capacitor $C_{Int}$ 110 of FIG. 2 has been replaced by a charge handling capacitor $C_{FD}$ 402. An example of such a circuit is, for example, disclosed in paper titled "A high speed camera system based on an image sensor in standard CMOS technology", Hillebrand, M et al. As shown in FIG. 4, the transfer gate transistor M4 304 is used here to separate the charge storage capacitor $C_{FD}$ from the radiation-sensing diode at the end of the integration period. While the signal stored by capacitor $C_{FD}$ can be held until the pixel is read out, the next integration period can be launched by applying a reset pulse to the gate of M1 thus resetting the radiation-sensing diode voltage to the reset voltage ready to be discharged by the subsequent integration phase.

Thus this solution allows the operation of a global shutter mode, but does not allow operation with variable sensitivity, as provided by the solution in FIG. 3. On the other hand, the selectable sensitivity solution in FIG. 3 does not allow the operation of a global shutter mode. In certain demanding applications both modes are required together in one device.

SUMMARY OF THE INVENTION

It is an object of the present invention to at least partially overcome limitations in the prior art. It is another object of embodiments of the present invention to provide a pixel architecture that allows selecting multiple different operating modes that each pixel can operate in.

According to a first aspect of the present invention there is provided an image sensor comprising a plurality of pixels each comprising a photosensor, a first node having a first capacitance connected to the photosensor, a second node having a second capacitance and selectively connected to the photosensor and reading means operable to read independently a first voltage value stored at the first node and a second voltage value stored at the second node.

The reading means can comprise first reading circuitry operable to read the first voltage value and second reading circuitry operable to read the second voltage value.

Preferably each pixel comprises a first transistor controllable to selectively connect the second node to the photosensor.

Each pixel can comprise a third node having a third capacitance and selectively connected to the photosensor. The third node may also have a third reading means associated with it for reading a third voltage value stored at this node.

Resetting means are preferably provided for resetting the first and second voltage values at the first and second nodes.

According to a further aspect of the present invention there is provided a method of sensing an image using an image sensor comprising a plurality of pixels each comprising a photosensor, a first node having a first capacitance connected to the photosensor, a second node having a second capacitance, and switching means for selectively connecting the second node to the photosensor, the method comprising a variable sensitivity mode comprising the following steps: controlling the switching means to connect the second node to the photosensor, storing a first voltage value at the second node; controlling the switching means to disconnect the second node from the photosensor; storing a second voltage value at the first node; and independently reading a selected one of the first and second voltage values.

The variable sensitivity mode can further comprise independently reading the other of the first and second voltage values. According to this mode the pixels of the image sensor can be arranged in rows and the steps of the variable sensitivity mode of operation are performed on the pixels of each row sequentially.

The sensor can preferably also be operated in a shutter mode of operation comprising the steps of, for each pixel in the image sensor, storing a voltage value at the second node, controlling the switching means to isolate the second node from the photosensor, and reading the voltage value. In this mode the step of controlling the switching means to isolate the second node is preferably performed at the same time in all the pixels of the image sensor.

The sensor can preferably also be operated in a high sensitivity mode of operation comprising the steps of controlling the switching means to disconnect the second node from the photosensor, storing a voltage value at the first node, and reading the voltage value.

The sensor can preferably also be operated in a high capacity mode of operation comprising controlling the switching means to connect the second node to the photosensor, storing a voltage value at the first and second nodes, and reading the voltage value from the first and second nodes.

According to a further aspect of the invention, there is provided a method of operating an image sensor comprising alternating between first and second phases of operation, the first phase comprising reading a first voltage value stored at the second node while storing a second voltage value at the third node, the second phase comprising reading a second voltage value stored at the third node while storing a first voltage value at the second node.

The first phase preferably comprises, before reading the first voltage value, controlling a first switching means to disconnect the second node from the photosensor, and controlling a second switching means to connect the third node to the photosensor. The second phase preferably comprises, before reading the second voltage value, controlling the second switching means to disconnect the third node from the photosensor, and controlling the first switching means to connect the second node to the photosensor.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

The figures form a part of the overall description of the invention. Throughout the figures like reference numerals are used for like components.

DETAILED DESCRIPTION

Figure 5:
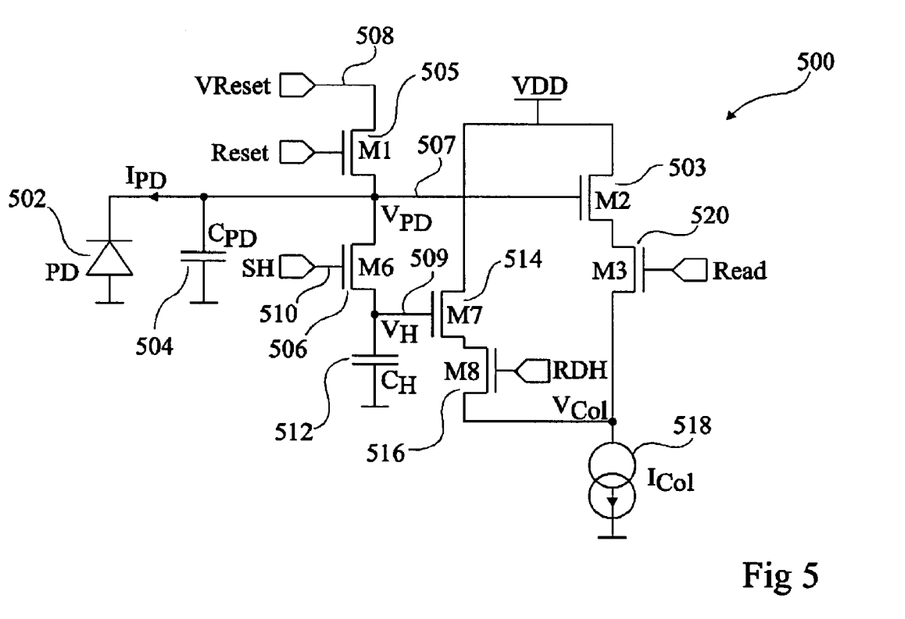
FIG. 5 is a simplified circuit diagram of an image sensing pixel according to a first embodiment of the present invention.

FIG. 5 represents a simplified circuit diagram of an image sensing pixel 500 according to one embodiment.

The sensing pixel of FIG. 5 comprises a photodiode PD 502 connected between a reference ground potential and a node 507 connected to the gate node of a MOS transistor M2 503, and having a parasitic capacitance represented by capacitor $C_{PD}$ 504 and shown connected in parallel to it. The voltage across the photodiode and capacitor $C_{PD}$ 504 is labelled $V_{PD}$. The gate node of transistor M2 503 is further connected to a first signal node of a MOS transistor M1 505, and to a first signal node of a MOS transistor M6 506. Transistor 505 receives a reset signal at its gate node, and has its second signal node connected to an input signal $V_{Reset}$ on line 508. Transistor M6 506 has its gate node connected to an input signal $S_H$ on line 510, and its second signal node connected to the reference ground potential via a capacitor $C_H$ 512. The second signal node of transistor M6 506 is also connected at node 509 to the gate node of a transistor M7 514, the voltage at node 509 being labelled $V_H$. The first signal node of transistor M7 514 is connected to reference potential $V_{DD}$, whilst the second signal node of transistor M7 514 is connected to a first signal node of a further MOS transistor M8 516, which receives a signal RDH at its gate node, and has its second signal node connected to the ground reference potential via a current source $I_{Col}$, 518. The voltage across the current source $I_{Col}$ 518 is labelled $V_{Col}$. A further MOS transistor M3 520 is also connected between the second signal node of transistor M8 516 and a first signal node of transistor M2 503, via its first and second signal nodes, and receives a read signal at its gate node. The second signal node of transistor M2 503 is connected to reference potential $V_{DD}$.

In operation, transistor 505 M1 provides the function of resetting the voltage across the radiation-sensing diode 502 and its associated parasitic capacitance $C_{PD}$ 504. For this purpose the reset voltage $V_{Reset}$ applied to the second signal node, for example the drain node, of transistor M1 505 is transferred to the first signal node, for example the source, node of transistor M1 505 when the Reset voltage is applied to the gate node of transistor M1 503 to turn it ON.

Transistors M2 503 and M3 520 provide a possible embodiment of readout transistors, configured to operate in a source follower operation: Transistor M2 503 represents the driver of the source follower supplied through its drain by $V_{DD}$. Current source $I_{Col}$ 518, usually common to all pixels in the column, represents the load of the source follower. Transistor M3 520 is used to select only one specific pixel at a time in a column through the activation signal Read.

Transistor M6 506 and capacitor $C_H$ 512 perform the function of allowing the full well capacitance of the device to be increased. While the gate signal of transistor M6 506, called $S_H$, is activated, the capacitance $C_H$ 512 is connected in parallel to capacitor $C_{PD}$ 504. This increases the charge handling capability of the pixel due to the increased effective capacitance. At the same time a signal can be stored by capacitor $C_H$ 512 at any time by turning OFF transistor M6 506.

Transistors M7 514 and M8 516 are readout transistors associated specifically with the capacitor $C_H$ 512. This means that the pixel has two independent readout paths. In this preferred embodiment, the two readout paths are connected to the same column line $V_{Col}$ and turned ON separately through two separate enable signals READ and RDH, but other configurations for multiple readout paths are also possible.

This additional capacitor and readout path allows, among other possible operation modes, the following main operating modes:

a) High Sensitivity Operation:

Transistor M6 506 stays off in this mode, so the pixel has a higher sensitivity.

b) High Full Well Operation:

Transistor M6 506 stays on in this mode, so the pixel has a higher charge handling capability giving better image quality. Both readout paths can be turned ON at the same time thereby increasing readout speed and reducing pixel fixed pattern noise and flicker noise.

c) High Dynamic Range Operation:

Firstly, in a reset phase, signals $S_H$ and Reset are turned ON to reset the voltages across capacitors $C_{PD}$ 504 and $C_H$ 512. When the signal Reset is turned OFF, the integration phase with high full well begins, wherein the two capacitors $C_{PD}$ 504 and $C_H$ 512 are connected in parallel and the radiation-generated current from the radiation-sensing photodiode PD 502 discharges the two capacitors simultaneously. Then the signal $S_H$ is turned OFF so that the connection between capacitor $C_{PD}$ 504 and capacitor $C_H$ 512 is interrupted and the integration phase with high sensitivity begins. The voltage at $V_H$ is kept frozen from the end of the high full well integration phase since the photocurrent does not discharge capacitor $C_H$ 512 anymore and at the same time the photocurrent discharges capacitor $C_{PD}$ 504 alone which results in a higher sensitivity to signal charges. This integration phase is terminated by the consecutive readout of the two voltages of capacitors $C_{PD}$ 504 and $C_H$ 512 by turning ON signals READ and RDH separately in the final read phase. From here, a new integration cycle can restart.

Figure 6:
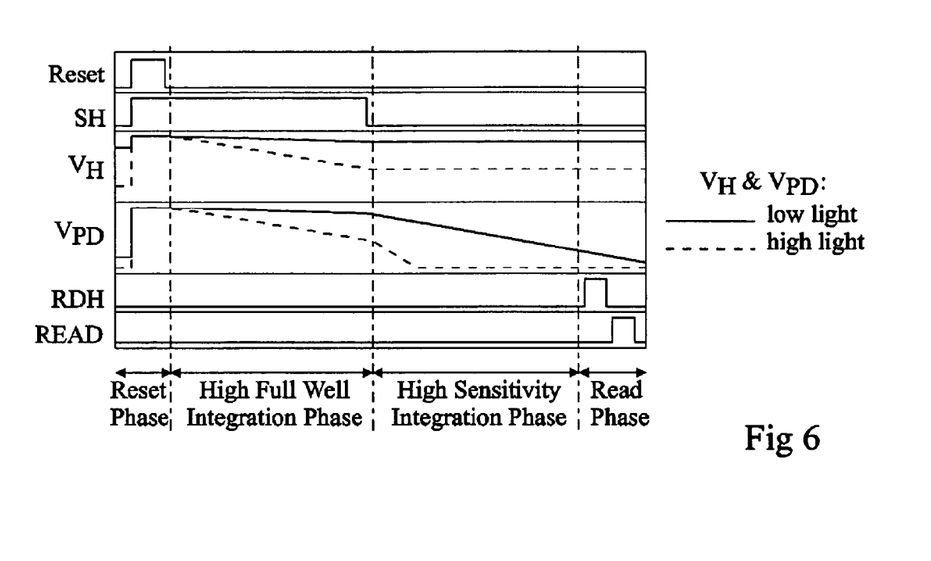
FIG. 6 is a timing diagram relating to an embodiment of the present invention.

The exemplary timing diagram shown in FIG. 6, with arbitrarily selected relationships between the duration of the different pulses and phases, shows the evolution of each of the voltages $V_H$ and $V_{PD}$ for two exemplary cases of high illumination (dashed lines) and low illumination (solid lines). At high illumination, voltage $V_H$ reaches a useful signal at the end of the high full well integration phase, while photodiode PD 502 becomes saturated in the following high sensitivity integration phase. So the useful information can be readout from capacitor $C_H$ 512 at node 509. If, on the other hand, the illumination is low, then the signal collected during the high full well phase and stored by voltage $V_H$ across capacitor $C_H$ 512 at the end of this phase is very small and would not give a good quality image signal. However, in the subsequent high-sensitivity integration phase, the photocurrent suffices to produce a sufficient signal stored as $V_{PD}$, which is then read out at the end of the integration phase at node 507.

For lower illuminations, the high sensitivity signal, read out as the voltage $V_{PD}$ across the photodiode capacitance $C_{PD}$ using transistors M2 503 and M3 520 by turning ON the signal READ, gives a useful image content value until it saturates for a certain medium illumination level. Above that the high full well signal, read out as voltage $V_H$ across capacitance $C_H$ 512 using transistors, M7 514 and M8 516 by turning ON signal RDH, continues to give a useful image content for higher illuminations until that also saturates when the total charge storage capacity of the sensor is reached.

Figure 7:
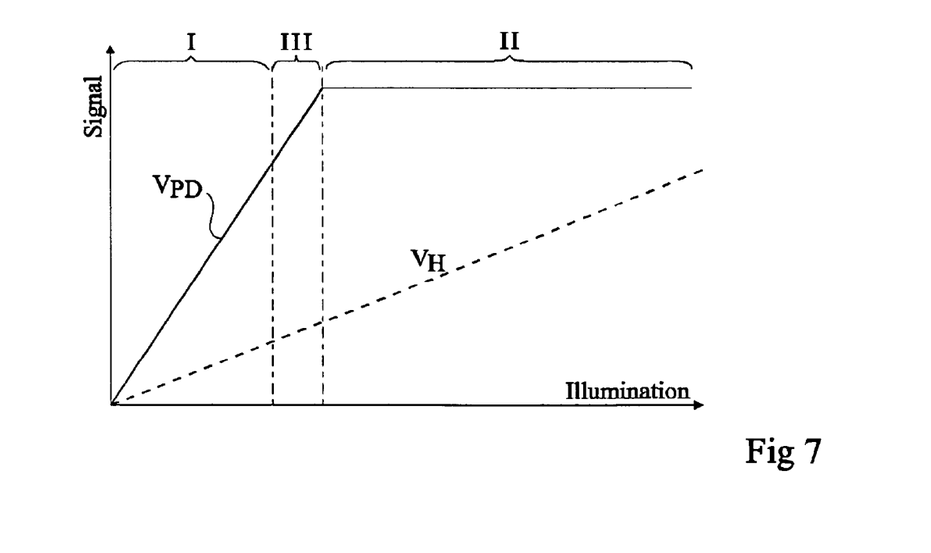
FIG. 7 is a graph showing signal voltage as a function of illumination relating to the embodiment of FIG. 5.
Figure 8:
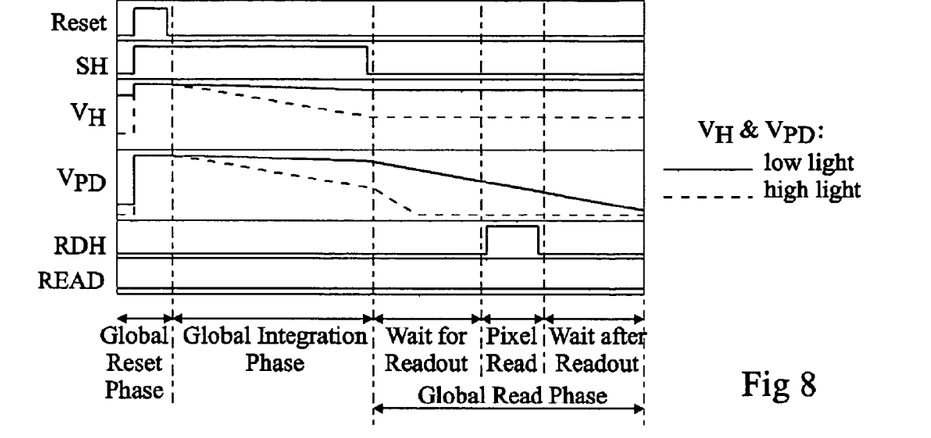
FIG. 8 is a timing diagram relating to the embodiment of FIG. 5.

The total signal range can thus be subdivided into three different regions as shown in FIG. 7, separated by dash-dotted lines: region I where the signal is gained from $V_{PD}$, region II where the signal is gained from $V_H$, and an intermediate region III where the signal can be gained from a mix of both signals.

d) Global Shutter Operation:

The signals for global shutter operation are provided in a similar fashion to signals provided for the High Dynamic Range Operation. An important difference is in the relationship between the pixels in different rows. In the high dynamic range operation the pixels are reset, integrated and read out in a row-by-row fashion. This is commonly referred to as a rolling shutter operation wherein the integration phases take place at periods shifted in time between the different rows of one image.

The global shutter operation is implemented in the present embodiment as follows:

Firstly all pixels of the sensor are reset at the same time in the global reset phase by applying the signal Resent, while the signal $S_H$ is also turned ON in all pixels to ensure that node 509 is reset as well as node 507. Next, the integration phase starts in all pixels simultaneously by turning OFF Reset. Thus all pixels capture the incoming radiation at the same time. This global integration phase is terminated by turning OFF all the $S_H$ signal lines for all pixels simultaneously, thus freezing the signal content on capacitor $C_H$ of all pixels, ready to be read out.

The readout in the global readout phase still takes place in a row by row fashion, such that every pixel waits for a different duration before being read out. A certain pixel is read out by turning ON the signal RDH only, since only the information on capacitor $C_H$ is relevant in this mode of operation. Then the pixel has to wait for the rest of the pixels to be read out before the global readout phase is over and a next image capture cycle can start.

Preferably an image sensor comprises an array of the individual pixels such as the pixel shown in FIG. 5, arranged in a grid to form rows and columns. In each pixel in a column the node labelled $V_{Col}$ which connects the second signal node of transistor M3 520 to the current source 518, is connected to a common column line, each of these column lines being connected to a current source. Although the pixel of FIG. 5 is illustrated including a current source, only one such current source is preferably provided per column. The current source can comprise a current mirror, for example. The read inputs RDH and Read of each pixel in a row are preferably respectively connected together to form a row read line for Read, and a second row read line for RDH. In this way, the read signals can be applied to each row in turn to output the required signals from each pixel of a row onto a different column line. Likewise, the signals $V_{Reset}$ and Reset, as well as $S_H$ of each pixel in a row can be connected such that rows of pixels can be controlled and reset at the same time. In the case of the global shutter mode, the signal $S_H$ is set for all the pixels in the array at the same time. It will be apparent that alternative arrangements of the pixels are possible.

Figure 9:
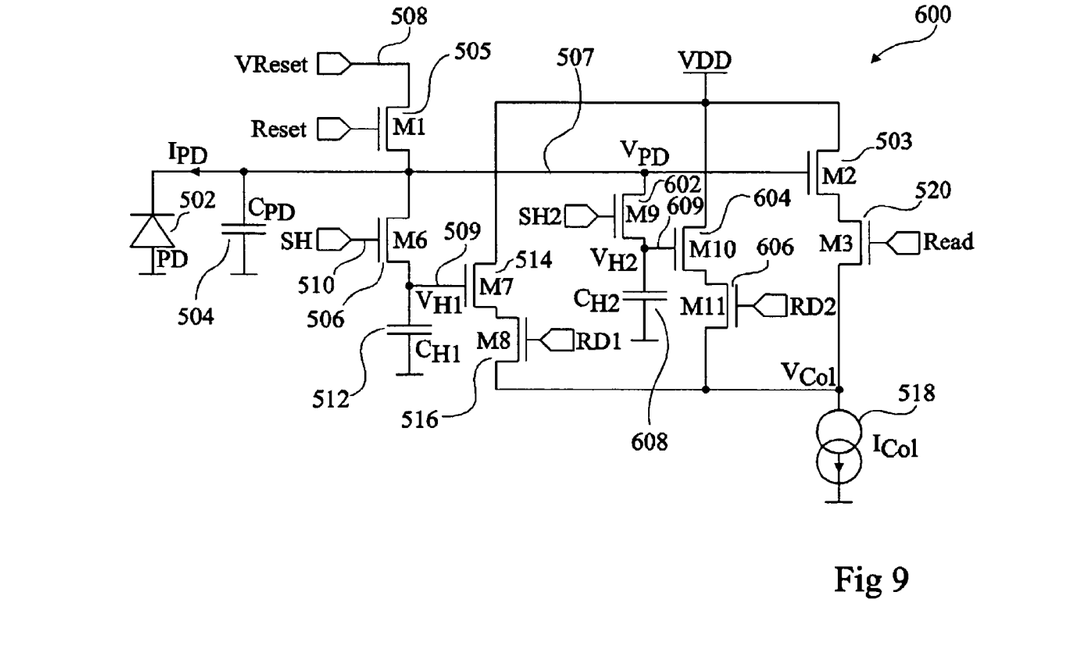
FIG. 9 is a simplified circuit diagram of an image sensing circuit according to another embodiment of the present invention.

FIG. 9 represents a simplified circuit diagram of an image sensing pixel 600 according to a further embodiment.

The circuitry of the image sensing pixel of FIG. 9 is identical to the circuitry of FIG. 5, but further comprises three MOS transistors M9, M10 and M11, labelled 602, 604 and 606 respectively, and a capacitor $C_{H2}$ 608 arranged in the same way as and in parallel to MOS transistors M6, M7 and M8 and capacitor $C_H$ of FIG. 5. In FIG. 9, capacitor $C_H$ of FIG. 5 has been relabelled $C_{H1}$, the input signals $S_H$ and RD have been relabelled $S_{H1}$ and $R_{D1}$, and the voltage $V_H$ has been relabelled $V_{H1}$.

As with transistor M6 506, a first signal node of transistor M9 602 is connected to the gate node of transistor M2 503, and the gate node of transistor M9 602 is connected to an input signal $S_{H2}$. The second signal node of transistor M9 602 is connected to the reference ground potential via a capacitor $C_{H2}$. The voltage across this capacitor is labelled $V_{H2}$. The second signal node of transistor M9 602 is also connected to the gate node of transistor M10 604. The first signal node of transistor M10 604 is connected to reference potential $V_{DD}$, whilst the second signal node of transistor M10 604 is connected to a first signal node of transistor M11 606, which receives an input signal RD2 at its gate node, and has its second signal node connected to the ground reference potential via the current source $I_{Col}$ 518, described in relation to FIG. 5.

In addition to the main readout path, the embodiment of FIG. 9 comprises two sample/hold elements with two associated readout paths:

Transistors M2 503 and M3 520 read the signal VPD across the photodiode capacitance when signal READ is turned ON;

The signal $V_{H1}$ is connected to voltage $V_{PD}$ through transistor M6 506 while signal $S_{H1}$ is turned ON and separated when $S_{H1}$ is turned OFF. Transistors M7 514 and M8 516 read the signal $V_{H1}$ across capacitor $C_{H1}$ when RD1 is turned ON;

The signal $V_{H2}$ is connected to voltage $V_{PD}$ through transistor M9 602 while signal $S_{H2}$ is turned ON and separated when signal $S_{H2}$ is turned OFF. Transistors M10 604 and M11 606 read the signal $V_{H2}$ across capacitor $C_{H2}$ when signal RD2 is turned ON.

The two additional sample/hold elements and associated readout paths allow, among other possible operation modes, the following main operating modes:

a) High Sensitivity Operation:

Transistors M6 506 and M9 602 stay off in this mode, so the pixel has a higher sensitivity, the photodiode capacitance 504 providing the only storage capacitance of the pixel.

b) High Full Well Operation:

Transistors M6 506 and/or M9 602 stay on in this mode by turning ON signals $S_{H1}$ and/or $S_{H2}$, so that the pixel has a higher charge handling capability giving better image quality. By selecting only one or both of the SH signals, the amount of full well can be selected in two different steps. If capacitors $C_{H1}$ 512 and $C_{H2}$ 608 have different capacitance values, then altogether four different full well modes are available. One with transistors M6 506 and M9 602 off, one with transistors M6 506 on and M9 602 off, one with transistor M6 506 off and transistor M9 602 on, and one with both transistors M6 506 and M9 602 on.

It is possible to turn ON up to three readout paths at the same time thereby increasing readout speed and reducing pixel fixed pattern noise and flicker noise.

c) High Dynamic Range Operations:

As before, the capacitors $C_{H1}$ 512 and/or $C_{H2}$ 608 are connected at the beginning of the integration phase and then disconnected during the integration phase to deliver signals at different full wells and different sensitivity levels.

Since two sample/hold stages are available in the pixel, either one or the other or both sample/hold stages can be disconnected during the integration phase, allowing for different sub-modes of the high dynamic range operating mode.

If both sample/hold stages are disconnected in the course of the integration phase, then they would preferably be disconnected at different points in time to give two distinctly different signals valid for two largely different illumination ranges. In this case three different signals are available from one pixel (see sample timing diagram FIG. 10)

Figure 10:
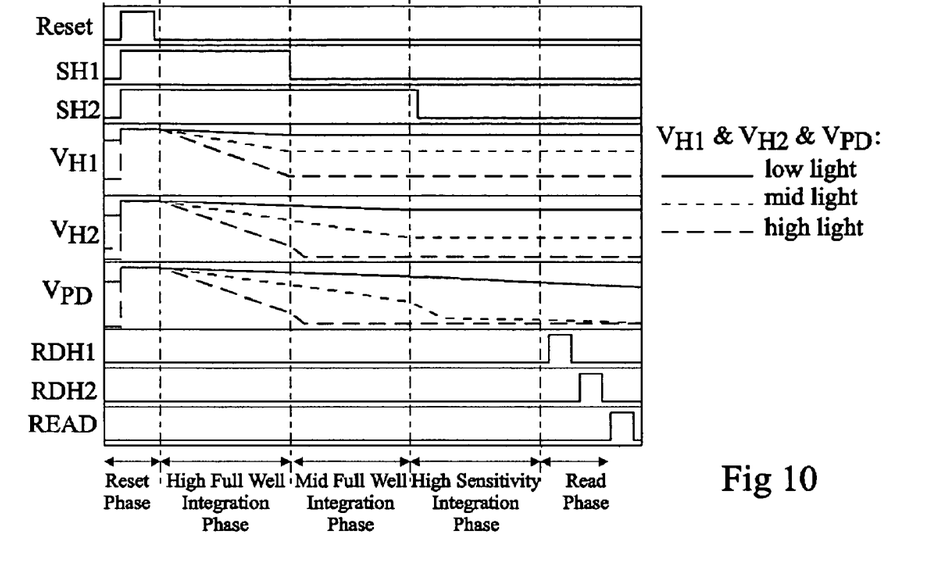
FIG. 10 is a timing diagram relating to the embodiment of FIG. 9.

As shown in FIG. 10, firstly there is the signal $V_{H1}$ across capacitor $C_{H1}$ 512 from the sample/hold stage that was turned OFF first and which has the lowest sensitivity to light since it was collected for the shortest time and has the largest total capacitance connected to $V_{PD}$.

Secondly there is the signal $V_{H2}$ across capacitor $C_{H2}$ 608 from the sample/hold stage that was turned OFF second and which has higher sensitivity to light than the first signal since it was collected for a longer time and has a smaller total capacitance connected to $V_{PD}$.

Thirdly there is the signal $V_{PD}$ across the photodiode capacitance which continues integration until the end of the integration phase, and in that last phase, having the smallest total capacitance, it thus has the highest sensitivity to radiation.

Figure 11:
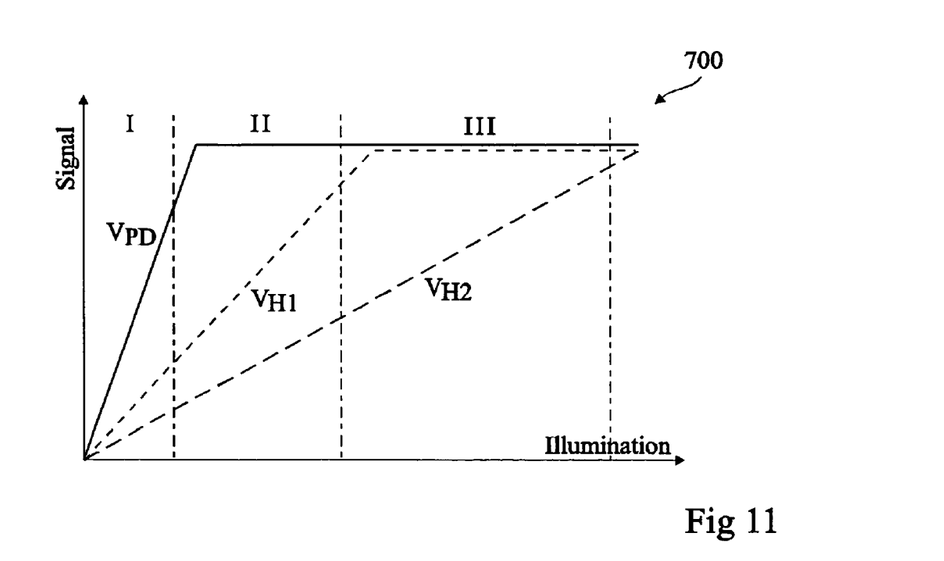
FIG. 11 is a graph showing signal voltage as a function of illumination relating to the embodiment of FIG. 9.

With reference now to FIG. 11, the total signal range can thus be subdivided into at least three different regions (see dash-dotted lines in FIG. 11): region I where the signal is gained from the voltage $V_{PD}$, region II where the signal is gained from the voltage $V_{H2}$, and region III where the signal is gained from the voltage $V_{H1}$. In the transitions between regions I and II as well between regions II and III a mix of the two signals $V_{PD}$ plus $V_{H2}$, and $V_{H2}$ plus $V_{H1}$, respectively may be used. The transitions between each of these regions for example occurs a little before saturation of each signal respectively.

d) Global Shutter Operation

The signals for global shutter operation can be provided in an identical fashion to the signals in the global shutter operation of the embodiment of FIG. 5 described above.

e) Read While Integrate Operation

According to the embodiment of FIG. 9, a read while integrate operation is possible. This operation mode operates very similarly to the global shutter operation, but two sample/hold stages and associated readout stages are provided for the storage of the integrated signal at the end of the global operation cycle. In order to make best use of these two stages, they are operated in an alternating fashion.

In one frame cycle the information is integrated and stored on capacitor $C_{H1}$ 512 by turning ON signal $S_{H1}$ only while the information integrated and stored on capacitor $C_{H2}$ 608 in the previous frame is readout through transistors M10 604 and M11 606 by turning ON signal RD1 on the different pixels sequentially.

At the end of the cycle, signal $S_{H1}$ is turned OFF to freeze the information on capacitor $C_{H1}$ 512. The next cycle begins by turning ON signals $S_{H2}$ and Reset in all pixels to reset the previous information stored on capacitor $C_{H2}$ 608. Then the integration of the next image information on capacitor $C_{H2}$ 608 for all pixels simultaneously can be started by turning OFF signal Reset on all pixels. At the same time the information stored before on capacitor $C_{H1}$ 512 in all pixels is now read out through transistors M7 514 and M8 516 by turning ON signal RD2 on the different pixels sequentially.

The readout path of transistors M2 503 and M3 520 is not necessary in this mode of operation, but could, for example, be used to non-destructively monitor the progress of the global integration operation while the readout operation is performed throughout the image sensor arrangement.

An image sensor, for example, comprises an array of the pixels of FIG. 9, arranged in a grid as described above in relation the embodiment of FIG. 5. The signal $S_{H1}$ and $S_{H2}$ can be connect together for pixels in the same row to allow rows of pixels to be controlled together. Again, alternative arrangement of the pixels is possible.

Figure 12:
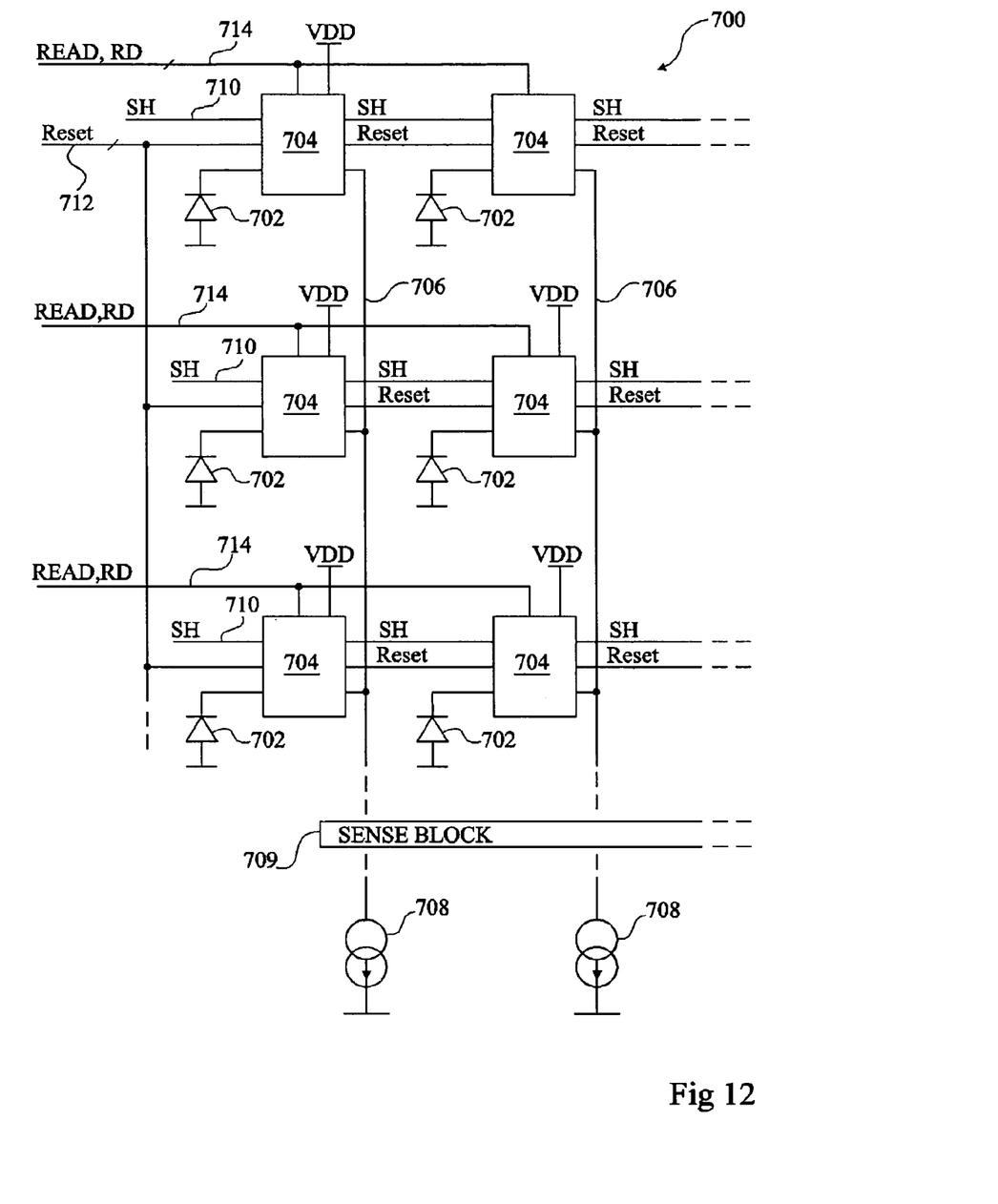
FIG. 12 is a schematic view of an image sensor according to embodiments of the present invention.

FIG. 12 illustrates part of an image sensor 700 comprising an array of photodiodes 702 each operating as a radiation sensor, and a pixel circuitry 704 connected to each photodiode 702. Each photodiode 702 and pixel circuitry 704 together comprise, for example, the image sensing pixel 500 of FIG. 5 or the image sensing pixel 600 of FIG. 9.

The pixels are connected in grid formed of rows and columns. Column lines 706 are provided, and as explained above, the output node $V_{COL}$ of each pixel 704 is connected to a common column line. Two such column lines 706 are illustrated in FIG. 12, although generally many more columns will be provided. Each column line is also connected to a current source 708, and to a sense block 709 for receiving and processing data read from the image sensor.

Three rows of the image sensor are shown, however again there will generally be many more. The rows are connected to common control lines 710, reset lines 712, and read lines 714. In particular, a control line 710 is provided for each row of the image sensor and is connected to each pixel circuit 704 in the row. Signal SH is applied to control line 710. In the embodiment of FIG. 5, this signal corresponds to the signal provided on line 510 to transistor M6 506. In the embodiment of FIG. 9, this signal comprises two signals, a first signal SH1 provided on line 510 to transistor M6 506, and a second signal SH2 provided to transistor 602. As explained above, this signal can be applied to each row in turn, or to all of the pixels in the image sensor to perform a global shutter operation.

Reset line 712 is connected to all of the pixel circuits 704 of the image sensor, such that a global reset can be performed. In alternative embodiments reset can be performed row by row.

Read lines 714 are connected to each the pixel circuits 704 of each row of the image sensor 700. A first read line is connected to transistor M3 520 providing the signal READ. In the embodiment of FIG. 5, a further read signal RDH is provided to transistor 516 of each pixel circuit. In the embodiment of FIG. 9, two further read signals RD1 and RD2 are provided connected to transistors M8 516 and M11 606 respectively. In the present embodiment, each row is therefore read one by one, and the data collected and processed by sense block 709.

Thus embodiments of the present invention provide an image sensing element for sensing an image comprising multiple readout elements each equipped with a dedicated charge holding element which can be selectively connected to or disconnected from the radiation sensing element. In particular they can independently read the voltage at their respective dedicated charge holding element, which are provided in the form of first and second nodes each having a respective capacitance. Thus reading the voltage at the first node does not affect the voltage stored at the second node and reading the voltage at the second node does not affect the voltage stored at the first node. Furthermore, the charge handling capacity of the image sensing element is increased while allowing the readout of the integrated charge to be conducted independently of further integration operations.

Whilst the embodiments described above comprise a photodiode for sensing the radiation, in alternative embodiments of the invention alternative types of photosensors could be used. Furthermore, whilst in the embodiments described above, the transistors are n-channel or p-channel MOS transistors, in other embodiments alternative transistor types could be used, such as bipolar transistors.

Whilst in the embodiments described above, capacitance $C_{PD}$ comprises the capacitance of the photodiode, in alternative embodiments this capacitance could be provided by other means, such as capacitance between signal paths, the parasitic capacitance at transistor gates, or by a capacitor specifically provided for that purpose. Likewise, the hold capacitors $C_H$, $C_{H1}$ and $C_{H2}$ are capacitances that may be provided by any means, for example by dedicated capacitors or by the inherent capacitance of these nodes.

Whilst a number of embodiments have been described having a number of advantageous features, in alternative embodiments of the present invention these features may be combined in any combination.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended to be limiting. The invention is limited only as defined in the following claims and the equivalent thereto.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An image sensor comprising a plurality of pixels each comprising:
    a photosensor;
    a first node having a first capacitance and connected to said photosensor;
    a second node having a second capacitance and selectively connected to said photosensor;
    signal acquisition means operable to connect first and second capacitances to the first node for a first time interval and disconnect second capacitance from the first node for a second subsequent time interval during a signal acquisition phase; and
    reading means operable to read independently a first voltage value stored at said first node and a second voltage value stored at said second node.

2. The image sensor of claim 1, wherein said reading means comprises first reading circuitry operable to read said first voltage value and second reading circuitry operable to read said second voltage value.

3. The image sensor of claim 1, further comprising a first transistor controllable to selectively connect said second node to said photosensor.

4. The image sensor of claim 1, further comprising a third node having a third capacitance and selectively connected to said photosensor.

5. The image sensor of claim 1, further comprising resetting means for resetting the first and second voltage values at the first and second nodes.

6. A method of sensing an image using an image sensor comprising a plurality of pixels each comprising a photosensor, a first node having a first capacitance connected to said photosensor, a second node having a second capacitance, and switching means for selectively connecting said second node to said photosensor, said method comprising:
connecting first and second capacitances to the first node for a first time interval and disconnecting second capacitance from the first node for a second subsequent time interval during a signal acquisition phase;
independently reading a selected one of a first voltage value at the first node and a second voltage value at the second node.

7. The method of claim 6 further comprises independently reading the other of said first and second voltage values.

8. The method of claims 6, wherein said pixels of said image sensor are arranged in rows and said independently reading is performed on the pixels of each row sequentially.

9. The method of claim 6, further comprising a shutter mode of operation comprising:
simultaneously for all pixels, storing second voltage values at the second nodes;
controlling said switching means to isolate said second nodes from the photosensors at each pixel; and
reading the second voltage values.

10. The method of claim 9 wherein said shutter mode step of controlling said switching means to isolate said second node is performed at the same time in all the pixels of said image sensor.

11. The method of claim 6, further comprising:
a high sensitivity mode of operation comprising the steps of controlling said switching means to disconnect said second node from said photosensor, storing a first voltage value at said first node, and reading said first voltage value.

12. The method of claim 6, further comprising:
a high capacity mode of operation comprising controlling said switching means to connect said second node to said photosensor, storing a third voltage value at said first and second nodes, and reading said third voltage value from said first and second nodes.

13. A method of operating an image sensor, the image sensor comprising a photosensor; a first node having a first capacitance and connected to said photosensor; a second node having a second capacitance and selectively connected to said photosensor; a third node having a third capacitance and selectively connected to said photosensor; and reading means operable to read independently a first voltage value stored at said first node and a second voltage value stored at said second node, said method comprising:
reading a first voltage value stored at said second node while storing a second voltage value at said third node; and
reading the second voltage value stored at said third node while storing a third voltage value at said second node.

14. The method of claim 13 further comprising:
before reading said first voltage value, controlling a first switching means to disconnect said second node from said photosensor, and controlling a second switching means to connect said third node to said photosensor; and before reading said second voltage value, controlling said second switching means to disconnect said third node from said photosensor, and controlling said first switching means to connect said second node to said photosensor.

15. An image sensor comprising a plurality of pixels, each pixel comprising:
a photosensor;
a first node having a first capacitance connected to the photosensor;
a second node having a second capacitance selectively connectable to the photosensor;
signal acquisition circuitry configured to connect first and second capacitances to the first node for a first time interval and disconnect second capacitance from the first node for a second subsequent time interval during a signal acquisition phase; and
a reader operable to independently read a first voltage value stored at the first node and a second voltage value stored at the second node.

16. The image sensor of claim 15, wherein the reader includes first reading circuitry operable to read the first voltage value and second reading circuitry operable to read the second voltage value.

17. The image sensor of claim 15, further comprising:
a first transistor controllable to selectively connect the second node to the photosensor.

18. The image sensor of claim 15, further comprising:
a third node having a third capacitance selectively connectable to the photosensor.

19. The image sensor of claim 15, further comprising:
resetting means for resetting the first and second voltage values at the first and second nodes.

20. An image sensor comprising a plurality of pixels, each pixel comprising:
a photosensor;
a first node having a first capacitance connected to said photosensor;
a second node having a second capacitance selectively connected to said photosensor;
a switch to selectively connect the second node to the photosensor;
a control to operate the switch during a signal acquisition phase to connect the second node to the photosensor such that a first voltage value stores at the second node and to disconnect the second node from the photosensor such that a second voltage value stores at the first node; and
a reader to independently read a selected one of the first and the second voltage values.

21. The method of claim 6 further comprising:
controlling said switching means to connect said second node to said photosensor;
storing a first voltage value at said second node;
controlling said switching means to disconnect said second node from said photosensor; and
storing a second voltage value at said first node.

22. The image sensor of claim 4 wherein the third capacitance differs in value from the second capacitance.

23. The method of claim 13 further comprising monitoring, by the reading means operable to read independently a voltage value at the first node, the progress of storing the second voltage value.

* * * * *